US007952196B1

(12) United States Patent
Iannotti et al.

(10) Patent No.: US 7,952,196 B1
(45) Date of Patent: May 31, 2011

(54) AFFORDABLE HIGH PERFORMANCE HIGH FREQUENCY MULTICHIP MODULE FABRICATION AND APPARATUS

(75) Inventors: Joseph Alfred Iannotti, Glenville, NY (US); Kevin Matthew Durocher, Waterford, NY (US); Christopher James Kapusta, Delanson, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 443 days.

(21) Appl. No.: 12/106,805

(22) Filed: Apr. 21, 2008

(51) Int. Cl.
*H01L 23/34* (2006.01)

(52) U.S. Cl. ... 257/728; 257/777; 257/790; 257/E25.03; 257/E25.013; 257/E23.019; 257/E23.085

(58) Field of Classification Search ............. 257/728, 257/777, 790, E25.03, E23.019, E23.085
See application file for complete search history.

(56) References Cited

U.S. PATENT DOCUMENTS

| 7,768,113 | B2 * | 8/2010 | Ozguz et al. | 257/686 |
| 2006/0267213 | A1 * | 11/2006 | Ozguz et al. | 257/777 |
| 2007/0035033 | A1 * | 2/2007 | Ozguz et al. | 257/777 |

OTHER PUBLICATIONS

PGS Graphite Sheets, Feb. 2006, Panasonic.

* cited by examiner

*Primary Examiner* — Jarrett J Stark
(74) *Attorney, Agent, or Firm* — McDermott Will & Emery LLP

(57) ABSTRACT

An interconnect assembly for use in high frequency applications includes an interconnect structure, a plurality of electronic die disposed on the interconnect structure, and an encapsulant at least partially surrounding the plurality of electronic die. The interconnect structure includes a plurality of layers. The interconnect assembly further includes a thermal management layer disposed within a portion of the encapsulant and proximate to the plurality of electronic die and a controlled impedance interconnect connected to the interconnect structure and extending to a peripheral surface of the interconnect assembly.

13 Claims, 5 Drawing Sheets

AFFORDABLE HIGH PERFORMANCE HIGH FREQUENCY MULTICHIP MODULE FABRICATION AND APPARATUS

FIELD

The present invention generally relates to packaging or assembly and, in particular, relates to affordable high performance high frequency multichip module fabrication and apparatus.

RELATED APPLICATIONS

This application is related to U.S. patent application Ser. No. 12/039,524, filed Feb. 28, 2008, entitled "Individual Die Handling Method and Apparatus for Stud Bumping," which is incorporated herein by reference in its entirety.

BACKGROUND

In the electronics industry, there are significant advantages to stacking and interconnecting integrated circuit packages to create high density, three-dimensional, multichip modules. Typical in module fabrication, I/O pads of the individual integrated circuit layers are interconnected using a variety of technologies, including conductive vias and metallized traces fabricated on the periphery of the module.

A fundamental advantage of stacking integrated circuit layers is the maximum utilization of limited surface area on a printed circuit board or substrate along with reduced interconnect parasitics. Stacking integrated circuit packages provides increased circuit density without requiring additional printed circuit board or substrate space. Further, stacking integrated circuit packages reduces signal lead lengths between the stacked components, reduces parasitic inductance and capacitance, which in turn, allows the circuits to operate at very high clock speeds and/or lower power consumption.

Current high frequency multichip electronic modules suffer from the disadvantage that they are very expensive and labor intensive to achieve high performance. For example, most modules employ low temperature co-fired ceramic (LTCC) or other exotic chip and wire substrates. These substrates are expensive and typically thick in nature.

In some instances, high frequency modules include modules operating in the radio frequency (RF) range. In other instances, high frequency modules include modules operating in the millimeter wave (MMW) range. In yet other instances, high frequency modules include modules operating in both RF and MMW range.

For high frequency modules employing RF chips, the RF chips are typically wire bonded or pre-packaged and solder attached onto the substrate to form the interconnect. This is not preferred due to parasitic losses and variability concerns caused by inconsistent wirebond lengths. For components that have delicate air bridge structures on their surface, wire bonding is not desirable because these structures are prone to damage and contamination. Soldering is not desirable for these structures due to flux contamination issues. Also, solder exposes the components to high temperatures and cleaning solvents, which may result in damage to components or cause substantial degradation of high frequency performance. RF chips are also typically fabricated with thick (>1 um) gold bond pads. As a result, solder/gold embrittlement will occur if chips are attached to an interconnect substrate via solder attach, thus degrading overall product reliability.

SUMMARY

According to one aspect of the disclosure, a method of the present invention allows a user fabricate high performance, affordable, high frequency multichip modules by leveraging currently available technologies and electronic packaging techniques. The method allows a user to combine modules in a tiled approach to create a variety of different sized geometries. Additionally, the method allows users to combine modules by stacking them.

In accordance with one aspect of the present invention, an interconnect assembly for use in high frequency applications comprises an interconnect structure, a plurality of electronic die disposed on the interconnect structure, and an encapsulant at least partially surrounding the plurality of electronic die. The interconnect assembly further comprises a thermal management layer disposed within a portion of the encapsulant and proximate to the plurality of electronic die and a controlled impedance interconnect connected to the interconnect structure and extending to a peripheral surface of the interconnect assembly. The interconnect structure comprises a plurality of layers. In some instances, high frequency applications include those operating in the radio frequency (RF) range. In other instances, high frequency applications include those operating in the millimeter wave (MMW) range and terahertz range. In yet other instances, high frequency applications include those operating in multiple ranges comprising some or all of the RF, MMW and terahertz range.

According to another aspect of the present invention, an interconnect assembly comprises an interconnect structure comprising a plurality of layers, a plurality of electronic die disposed on the interconnect structure, and an encapsulant at least partially surrounding the plurality of electronic die. The interconnect assembly further comprises a plurality of controlled impedance interconnects connected to the interconnect structure and extending through a portion of the encapsulant to a peripheral surface of the interconnect assembly. Each of the plurality of interconnect layers comprise electronic routing components. Each of the plurality of controlled impedance interconnects comprise an electrical conductor surrounded by a dielectric.

According to yet another aspect of the present invention, a method for manufacturing an interconnect assembly for use in high frequency applications comprises forming an interconnect structure having a top and bottom surface and attaching a plurality of electronic die onto the top surface of the interconnect structure. The interconnect structure has a plurality of interconnect layers. The method further comprises encapsulating the plurality of electronic die with an encapsulant, thereby forming an encapsulation layer having a top and bottom surface, and placing a thermal management layer within the encapsulation layer. The method further comprises forming a plurality of via holes in the encapsulation layer and thermal management layer such that each via extends from the top surface of the interconnect structure to a peripheral surface of the interconnect assembly. The method still further comprises providing a conductive material into the plurality of via holes, thereby forming an interconnect accessible at the peripheral surface of the interconnect assembly.

Additional features and advantages of the invention will be set forth in the description below, and in part will be apparent from the description, or may be learned by practice of the invention. The objectives and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

Various aspects of a system of the present invention are illustrated by way of example, and not by way of limitation, in the accompanying drawings, wherein.

DETAILED DESCRIPTION

Figure 1:
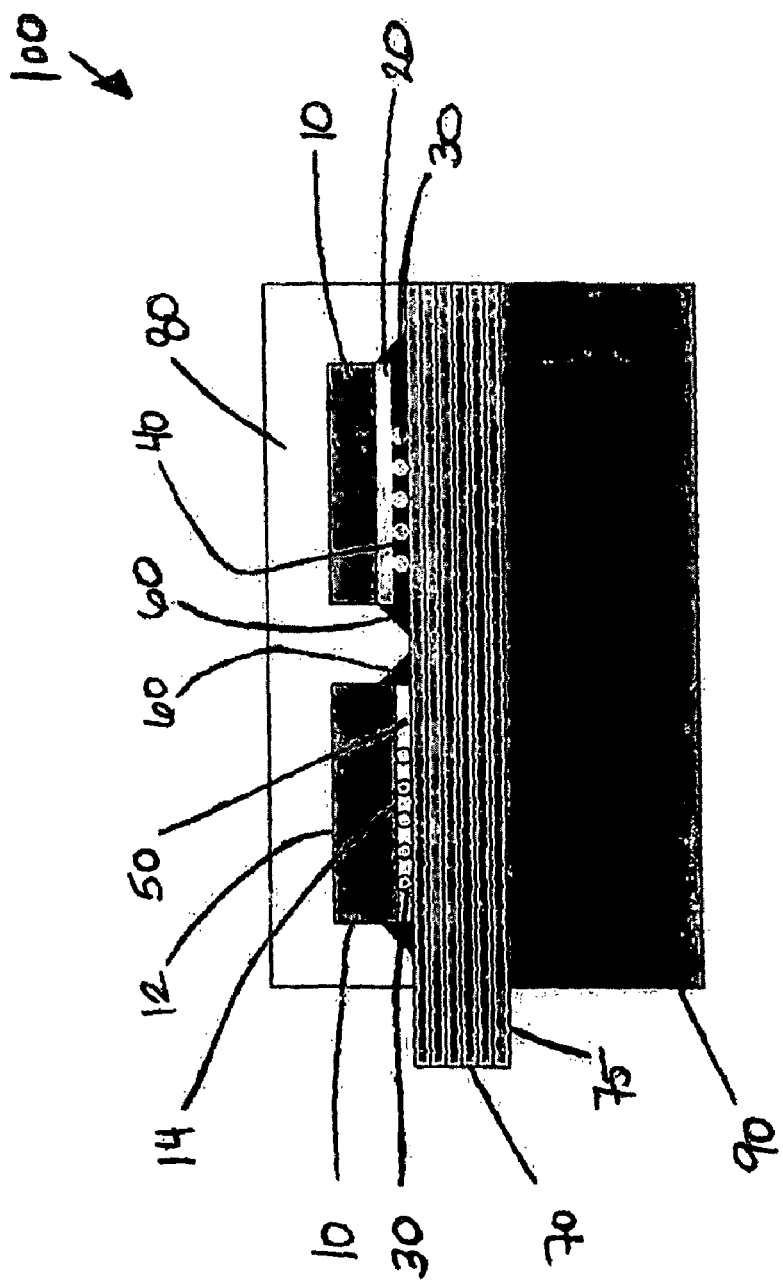
FIG. 1 illustrates an exemplary multichip module assembly in accordance with one aspect of the present invention.

In the following detailed description, numerous specific details are set forth to provide a full understanding of the present invention. It will be obvious, however, to one ordinarily skilled in the art that the present invention may be practiced without some of these specific details. In other instances, well-known structures and techniques have not been shown in detail to avoid obscuring concepts of the present invention.

Reference will now be made in detail to aspects of the subject technology, examples of which are illustrated in the accompanying drawings, wherein like reference numerals refer to like elements throughout.

To produce high density, three-dimensional, multichip modules that are resistant to contamination, packaging processes may include encapsulating die. Encapsulation is desirable because, for example, it provides support for die and die/substrate breakage, a primary source of interconnect failure. High density interconnect (HDI) processes are typically referred to as "chips first" because a user starts with the die already attached to a first layer interconnect, and sequential processing is performed to fabricate the multilayer assembly. One of the problems with this approach is that the HDI process is very expensive, one cannot pre-test the interconnect layers, and it is difficult to rework bad components.

FIG. 1 illustrates an exemplary multichip module (MCM) assembly in accordance with one aspect of the present invention. An MCM assembly 100 includes a plurality of individual die 10, an interconnect structure 70, and an encapsulant 80. A die 10 may be an electronic die, typically formed from a semiconductor wafer, such as a silicon or germanium wafer, and include suitable circuitry therein formed by semiconductor processing techniques. A die 10 may be any suitable integrated circuit die having any suitable use. For example, in some instances, die 10 comprises a microwave monolithic integrated circuit (MMIC) die, in other instances, die 10 comprises a microelectromechanical system (MEMS) die, and in still other instances, die 10 comprises a low noise amplifier (LNA) die. Additionally, although two die 10 are illustrated in FIG. 1, the present invention contemplates any number of die to be used within the teachings of the present invention.

A die 10 includes a top surface 12 and a bottom surface 14. Bottom surface 14 includes a plurality of contact pads (not shown) disposed thereon. The contact pads are any suitably sized contact pads that function to couple the circuitry within die 10 to circuitry associated with interconnect structure 70.

In one aspect, die 10 includes a chip scale package (CSP) 20 connected to bottom surface 14. CSP 20 may be a single-die, direct surface mountable package with an area of less than or equal to 1.2 times the area of die 10. CSP 20 may comprise a liquid crystalline polymer (LCP) capped CSP. Such a LCP capped CSP allows for contact pad redistribution and protection to delicate structures such as air bridges (not shown).

Regardless of whether die 10 includes a CSP 20 or not, die 10 may be attached to interconnect structure via stud bumps 30. Stud bumps 30 may comprise any suitable conductive material, including, but not limited to gold, copper, or combinations thereof. In one aspect, stud bumps 30 comprise gold or a gold alloy. In another aspect, stud bumps 30 comprise copper or a copper alloy.

Any suitable stud-bumping processes known in the art may be used to produce stud bumps 30. In one aspect, stud bumping is performed according to the method taught by U.S. patent application Ser. No. 12/039,524, filed Feb. 28, 2008, entitled "Individual Die Handling Method and Apparatus for Stud Bumping." This stud bumping process uses thermosonic attachment to connect die to a substrate. It is a low temperature, no clean process that provides a very low parasitic interconnect. This stud bumping process is repeatable, enabling a reduction in manual MCM tuning post assembly. Additionally, by using such a stud bumping process, an MCM assembly process is simple and consistent and allows the user to use current-off-the-shelf (COTS) components.

In one aspect, MCM assembly 100 may include a non-conductive "underfill" 40. Underfill 40 may comprise any suitable non-conductive adhesive. Underfill 40 joins bottom surface 14 of chip 10 to interconnect structure 70. When die 10 includes a CSP 20, underfill 40 may join CSP 20 to interconnect structure 70.

In another aspect, MCM does not include underfill 40. In such case, the area between the die 10 and interconnect structure 70 may contain a gas, such as air 50.

When employing an underfill 40, the underfill may be "full" or "partial." A "full" underfill extends along the entire bottom surface 14 of chip 10. In contrast, a partial underfill does not extend along the entire bottom surface 14 of chip 10.

Use of underfill 40 includes a number of benefits. For example, underfill 40 protects stud bumps 30 from moisture or other environmental hazards, and provides additional mechanical strength to MCM assembly 100. Underfill 40 also compensates for any thermal expansion difference between die 10 and interconnect structure 70. Additionally, underfill 40 mechanically "locks together" die 10 and interconnect structure 70 so that differences in thermal expansion do not break or damage the electrical connection of stud bumps 30. Partial underfill can be along the perimeter, therefore not affecting airbridge structures or degrading RF die performance.

Underfill 40 may be inserted by any suitable means. For example, underfill 40 may be needle-dispensed along the edges of each chip. In this method, it is drawn into the under-die space by capillary action, and heat-cured to form a permanent bond.

In addition to underfill 40, a sealant such as dam sealant 60 may be included in MCM assembly 100. Dam sealant 60 provides another layer of protection for stud bumps 30 from contamination and also provides additional mechanical strength to MCM assembly 100. Similar to underfill 40, dam sealant 60 may comprise any suitable non-conductive adhesive. In one aspect, dam sealant 60 and underfill 40 comprise the same material.

Still referring to FIG. 1, interconnect structure 70 includes a plurality of interconnect layers 75. Interconnect layers 75 include electronic routing components (not shown), such as conductors. In one aspect, interconnect layers 75 are formed via thin film processing techniques such as roll-to-roll or panel processing. Roll-to-roll processing is desirable because it is fairly inexpensive and provides extremely high performance. In roll-to-roll processing, electronic routing components are created on a roll of flexible plastic or metal foil. In some instances, the electronic routing components are patterned directly onto the roll of flexible plastic or metal foil. In other instances, the electronic routing components are patterned using photolithography techniques.

In one aspect, interconnect layers 75 comprise thin film materials. Suitable thin film materials include, but are not limited to, liquid crystal polymers, polyimides such as Kapton® polyimide, fluoropolymers such as teflon (e.g., Rogers 2800 or Microlam), Espanex®, etc. In one aspect, interconnect layers 75 comprise organic thin film materials, e.g., carbon-based materials.

Encapsulant 80 may comprise an overmold material such as an epoxy resin. In one aspect, encapsulant 80 is electrically and thermally conductive. Encapsulant 80 generally forms an encapsulation layer over die 10 by overmolding or encapsulating die 10. Overmolding is a process of encapsulating at least top surface 12 of die 10 opposite the side carrying the contact pads, thereby leaving bottom surface 14 of die 10 carrying the contact pads exposed for bonding or board mounting. Overmolding may be performed by any suitable process, and is typically performed under pressure.

In one aspect, MCM assembly 100 may further include a substrate 90. In one aspect, substrate 90 is disposed under interconnect structure 70. Substrate 90 may behave as a stiffener, thereby providing additional mechanical strength to MCM assembly 100.

Substrate 90 may be a semi-rigid or rigid substrate. Suitable substrates include substrates of epoxy/glass, ceramic, glass, silicon, metal, metal oxides, or combinations thereof. For example, in one aspect, substrate 90 is fabricated from alumina. In one aspect, rigid substrate 90 is tooled to a predetermined size. Substrate 90 is larger than a plurality of die 10.

Figure 2:
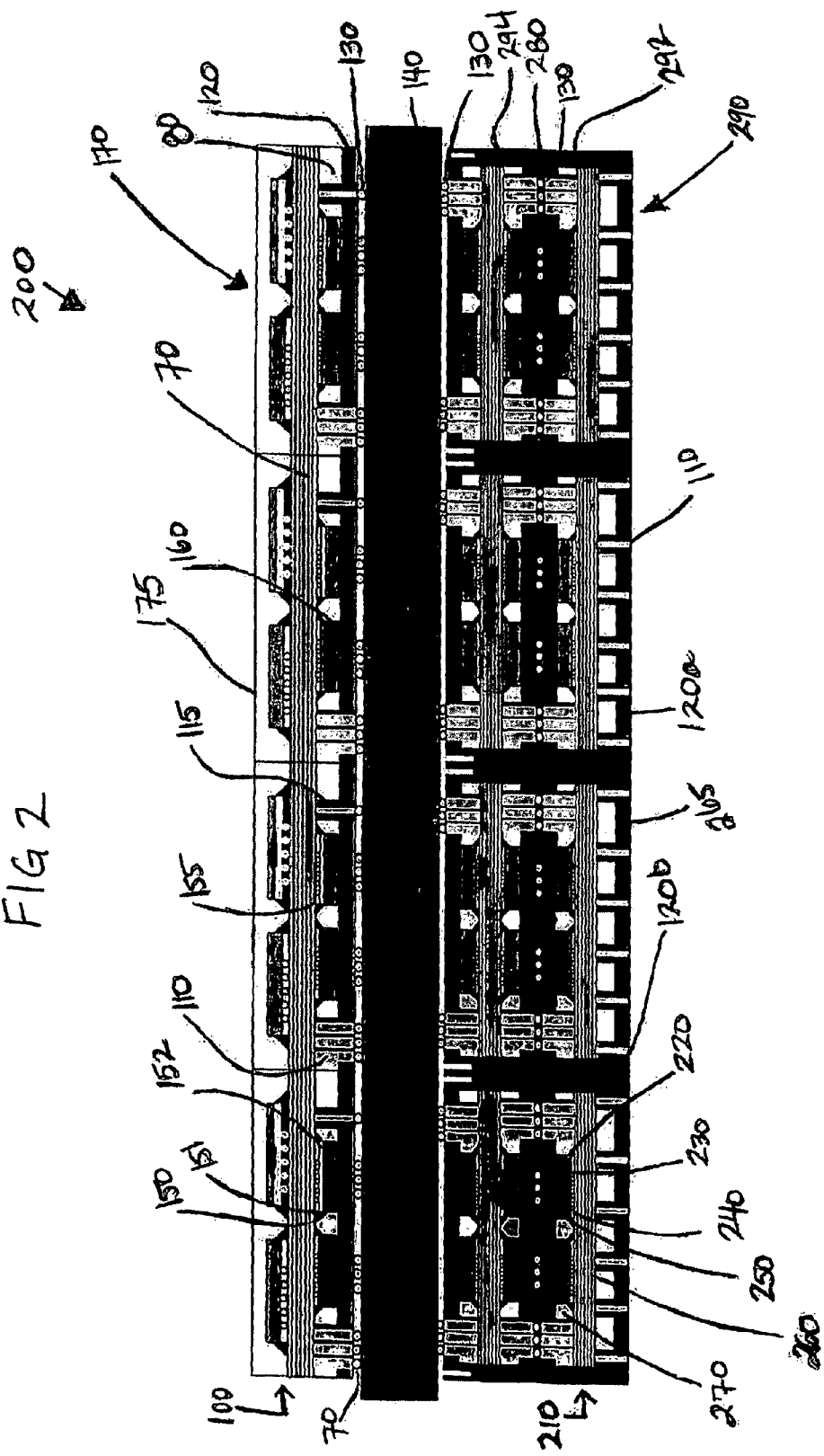
FIG. 2 illustrates an exemplary multichip module assembly in accordance with one aspect of the present invention.

Referring now to FIG. 2, an exemplary MCM assembly 200 in accordance with one aspect of the present invention is shown. For example, MCM assembly 200 may comprise a sensor array which utilizes a number of MMIC die and LNA die. In one aspect, MCM assembly 200 comprises a plurality of MCM assembly 100.

Besides MCM assembly 100, MCM assembly 200 may also include controlled impedance interconnects 110, dielectric 115, a plurality of die assemblies 150, a plurality of die assemblies 160, a plurality of MCM assemblies 210, and a plurality of thermal management layers such as a heat spreader 120, a heat spreader 140, and heat spreaders 120a and 120b. The contents of MCM assembly 200 above heat spreader 140 may comprise a first MCM layer 170. The contents of MCM assembly 200 beneath heat spreader 140 may comprise a second MCM layer 290.

A controlled impedance interconnect 110 is a conductor (e.g., a coaxial conductor), typically formed from depositing a conductive material into a via hole (not shown). Controlled impedance interconnect 110 is separate conductive entity from interconnect structure 70, and is not formed within interconnect structure 70. However, controlled impedance conductor 110 is connected to interconnect structure 70 by, for example, a fastener (not shown). Suitable fasteners include, but are not limited to, materials such as adhesives (e.g., adhesive displacement) and mechanical structures such as pins.

Additionally, in one aspect, controlled impedance interconnect 110 further includes a dielectric 115. Dielectric 115 may comprise any suitable material capable of behaving as an electrical insulator. Dielectric 115 at least partially surrounds controlled impedance interconnect 110, thereby preventing the flow of electric current from controlled impedance interconnect 110 to other components of MCM assembly 200.

Generally, controlled impedance interconnect 110 provides a conductive path from interconnect structure 70 to a peripheral surface 170 of MCM assembly 200. Consequently, a user may pre-test interconnect structure 70 and die connected to interconnect structure 70 prior to assembly (e.g., stacking the assemblies) to ensure functionality.

Still referring to FIG. 2, die assembly 150 is connected to interconnect structure 70 and opposite to a die 10 of MCM assembly 100 having a CSP 20 connected to its bottom surface 14. As shown, die assembly 150 includes a dam sealant 151, a CSP 152, and air 155 between CSP 152 and interconnect structure 70.

Likewise, die assembly 160 is connected to interconnect structure 70 and opposite to a die 10 of MCM assembly 100 not having a CSP 20. Die assembly 160 does not include a CSP. As shown, die assembly 160 is similar to its MCM assembly 100 counterpart. Both die assembly 150 and die assembly 160 are encapsulated by encapsulant 80. Additionally, while the die in die assemblies 150 and 160 appear to be of a smaller size than die 10 in MCM assembly 100, the die may nonetheless be the same size, provided there is room for interconnect structure 70.

Heat spreader 120 is located proximate to die assembles 150 and 160. In one aspect, heat spreader 120 is in contact with die assemblies 150 and 160. In another aspect, heat spreader 120 is spaced apart from die assemblies 150 and 160 with encapsulant 80 filling the void. Additionally, in one aspect, encapsulant 80 (which can be, for example, thermal material such as thermal grease or epoxy) may fully encapsulate heat spreader 120, such that encapsulant 80 fills a void between heat spreader 120 and peripheral surface 170.

As shown in FIG. 2, controlled impedance interconnect 110 extends from an outer surface of interconnect structure 70 to a peripheral surface 175. In one aspect, controlled impedance interconnect 110 is formed by removing material from encapsulant 80 and heat spreader 120 to create via holes (not shown). Conductive material is then provided into the via holes, thereby forming controlled impedance interconnect 110. As stated above, in one aspect, dielectric material may also be provided into the via holes, thereby forming dielectric 115.

Via holes may be created by a material removal technique such as drilling. Alternatively, via holes may be created by fabricating them up, e.g., producing layers such as encapsulant 80 and heat spreader 120 already having preformed via holes within them.

Controlled impedance interconnect 110 and heat spreader 120 or controlled impedance interconnect 110 and encapsulant 80 may then connect first MCM layer 170 in a three dimensional MCM assembly 200 by connection means such as stud bumps 130. As shown, stud bumps 30 are connected to heat spreader 140. Heat spreader 140 may be a flexible, semi-rigid or rigid material capable of dissipating heat and providing sufficient strength to MCM assembly 200. In one aspect heat spreader 140 comprises a rigid flex printed circuit board (PCB). Such rigid flex PCB may include, for example, electronic routing components (e.g., interconnects) as desired.

As mentioned above, the contents of MCM assembly 200 beneath heat spreader 140 comprise second MCM layer 290. MCM layer 290 includes a plurality of MCM assemblies 210, a plurality of controlled impedance interconnects 110, a plurality of lateral heat spreaders 120a, and a plurality of vertical heat spreaders 120b. Similar to heat spreader 140, in one aspect, heat spreaders 120a, 120b may include electronic routing components (e.g., interconnects) as desired.

A cut-away cross-section 280 of heat spreader 120a shows how MCM layer 290 is interconnected. Consequently, upon inspection, MCM layer 290 can be further broken into two sub-layers 292 and 294, in which sub-layer 292 includes the MCM assembly 210 beneath cut-away cross-section 280 and sub-layer 294 includes the contents above cut-away cross-section 280. This breaking of MCM layer 290 into sub-layers 292 and 294 is desirable because sub-layer 294 is a repetition of sub-layer 292, with the slight modification that sub-layer 294 has die arranged on both sides of an interconnect structure instead of having die and controlled impedance interconnects arranged on either side of an interconnect structure like sub-layer 292. Therefore, the discussion will focus on sub-layer 292.

Sub-layer 292 includes MCM assembly 210. MCM assembly 210 includes a plurality of die 220 connected to an interconnect structure 260 via stud bumps 230. The area between the die 220 and interconnect structure 260 contains a gas, such as air 240. MCM assembly 210 includes a dam sealant 250 and encapsulant 270.

Die 220 are located proximate to a horizontal heat spreader 120a. In one aspect, heat spreader 120a is in contact with die 120. In another aspect, heat spreader 120a is spaced apart from die 120 with encapsulant 270 filling the void.

A plurality of controlled impedance interconnects 110 extend from interconnect structure 260 to a peripheral surface 265 of MCM assembly 200. Another plurality of controlled impedance interconnects 110 extend from interconnect structure 260 and through sub-layer 292 to sub-layer 294, where the controlled impedance interconnects 110 are connected to a plurality of controlled impedance interconnects extending from sub-layer 294. Such connection may be achieved by a plurality of stud bumps 130, as shown in cut-away cross-section 280.

Similar to first MCM layer 170, second MCM layer 290 is connected in three-dimensional MCM assembly 200 by connection means such as stud bumps 130.

It should be noted that while FIG. 2 shows four MCM assemblies 100 disposed horizontally and adjacent to one another above heat spreader 140, MCM assembly 200 may include additional MCM assemblies 100 disposed horizontally and adjacent to one another. MCM 200 may also include additional MCM assemblies 200 disposed horizontally and adjacent to one another below heat spreader 140. In addition, MCM assembly 200 may include additional MCM assemblies 100 and/or MCM assemblies 200 disposed vertically. Furthermore, while MCM assembly 200 is shown with one heat spreader 140 that is disposed across the entire horizontal length of MCM assembly 200, MCM assembly 200 may include additional heat spreaders that are disposed across the entire horizontal length of MCM assembly 200. These additional heat spreaders may be spaced from one another in the vertical direction of the MCM assembly 200.

Figure 3:
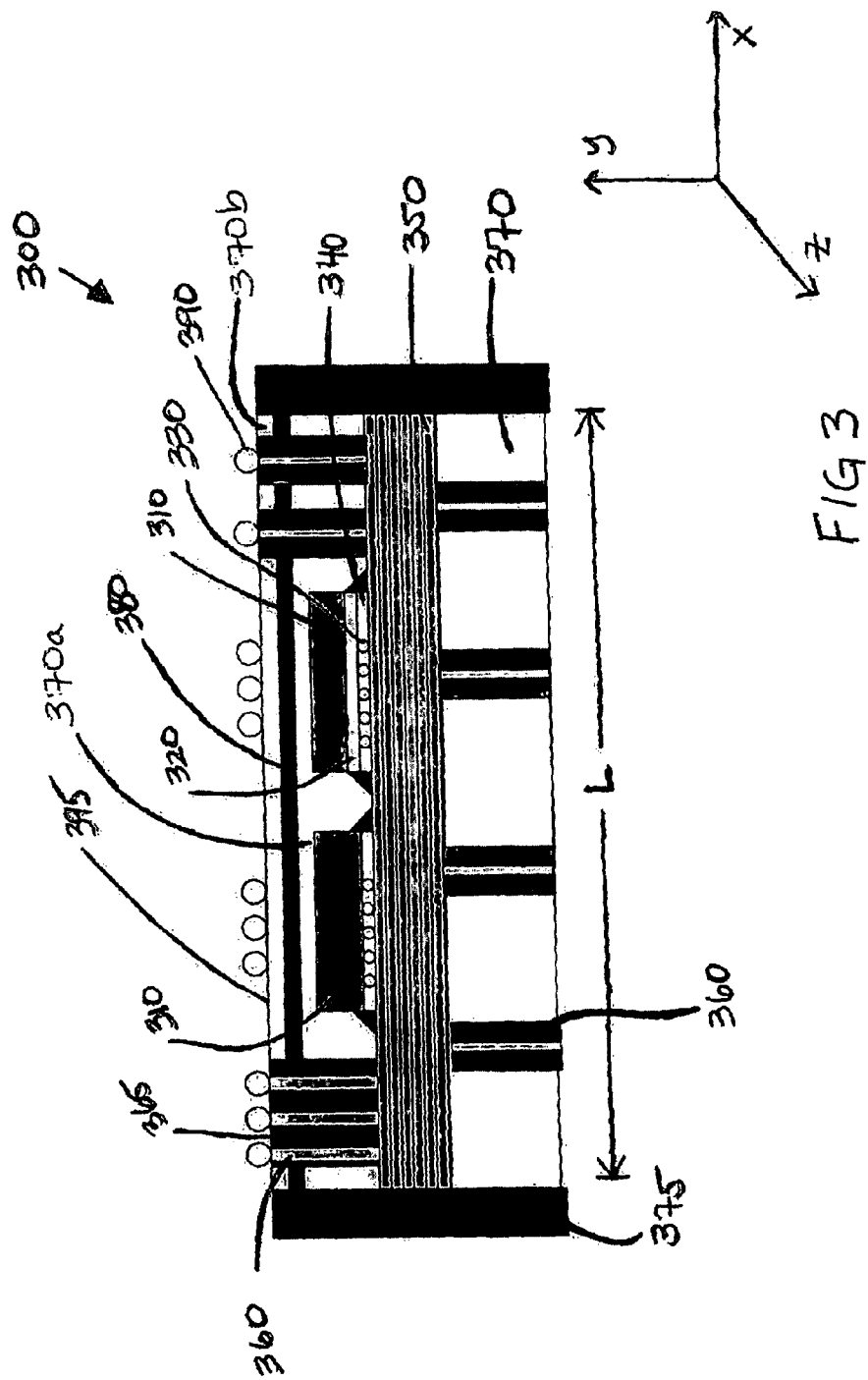
FIG. 3 illustrates an exemplary multichip module assembly in accordance with one aspect of the present invention.

Referring now to FIG. 3, an exemplary MCM assembly 300 in accordance with one aspect of the present invention is shown. MCM assembly 300 includes a plurality of die 310, an interconnect structure 350, an encapsulant 370, a plurality of controlled impedance interconnects 360, and a thermal management layer such as a heat spreader 380.

Die 310 may include a CSP 320. Die 310 are connected to interconnect structure 350 via suitable means, such as stud bumps 330. In one aspect, the area between die 310 and interconnect structure 350 comprises a fluid, such as air 340.

As shown, controlled impedance interconnects 360 include a dielectric 365. Controlled impedance interconnects 360 extend from an outer surface of interconnect structure 350 to a peripheral surface 395 of MCM assembly 300, extending through encapsulant 370 and thermal management layer 380. In some aspects, controlled impedance interconnects 360 are disposed adjacent to and extend along a side of the plurality of electronic die 310. In such cases, controlled impedance interconnects 360 are separate from interconnect structure 350. Furthermore, in one aspect, each controlled impedance interconnect 360 comprises a resistance of 50 ohms ($\Omega$).

In one aspect, heat spreader 380 is located within encapsulant 370 and extends the length L of MCM assembly 300. In one aspect, heat spreader 380 is located outside of encapsulant 370 and extends the length L of MCM assembly 300. Some portions of encapsulant 370 are identified below as encapsulant 370a and encapsulant 370b, for ease of reference. For example, in one aspect, encapsulant 370a may encapsulate die 310. In another aspect, encapsulant 370a may encapsulate die 310 and encapsulant 370b may encapsulate heat spreader 380. When heat spreader 380 is encapsulated by encapsulant 370b, encapsulant 370b may be tailored to a specific height (e.g., to make surface 395 flushes with controlled impedance interconnects 360) and bumped with stud bumps 390. In such an example, encapsulant 370b may be ground to the specific height.

Heat spreader 380 may comprise any suitable material capable of removing or dissipating heat from die 310. In one aspect, heat spreader 380 comprises a graphite sheet fabricated from pyrolitic graphite (PGS). As an example, PGS having a thickness of 1 mm may result in heat dissipation of 1200° C./mK in the lateral direction (in the x-z plane) and 15° C./mK in the vertical direction (in the x-y plane). As another example, PGS having a thickness of 10 mm may result in heat dissipation of 1200° C./mK in the lateral direction and 15° C./mK in the vertical direction.

In one aspect, MCM assembly 300 may further include additional thermal management layers such as conductive plates 375. In one aspect, conductive plates 375 are disposed along the sides of MCM assembly 300, and are disposed adjacent to and extend vertically along a side of interconnect structure 350, along a side of the plurality of electronic die 310, along a side of encapsulant 370, and/or along a side of controlled impedance interconnects 360. Conductive plates 375 may provide additional mechanical strength to MCM assembly 300 and may also aid in heat removal. For example, in one aspect, conductive plates 375 may be used as part of a liquid cooling assembly.

Figure 4:
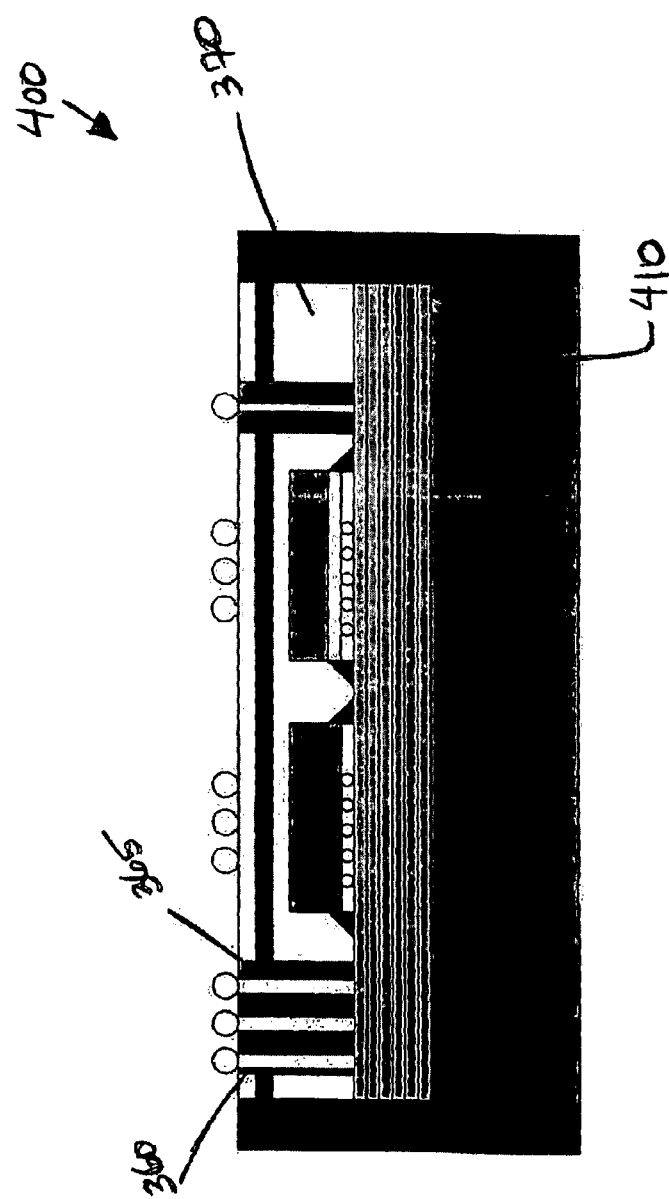
FIG. 4 illustrates an exemplary multichip module assembly in accordance with one aspect of the present invention.

Referring now to FIG. 4, an exemplary MCM assembly 400 in accordance with one aspect of the present invention is shown. MCM assembly 400 is similar to MCM assembly 300, with a slight modification that a plurality of controlled impedance interconnects 360 and a portion of encapsulant 370 have been replaced with a substrate 410.

Figure 5:
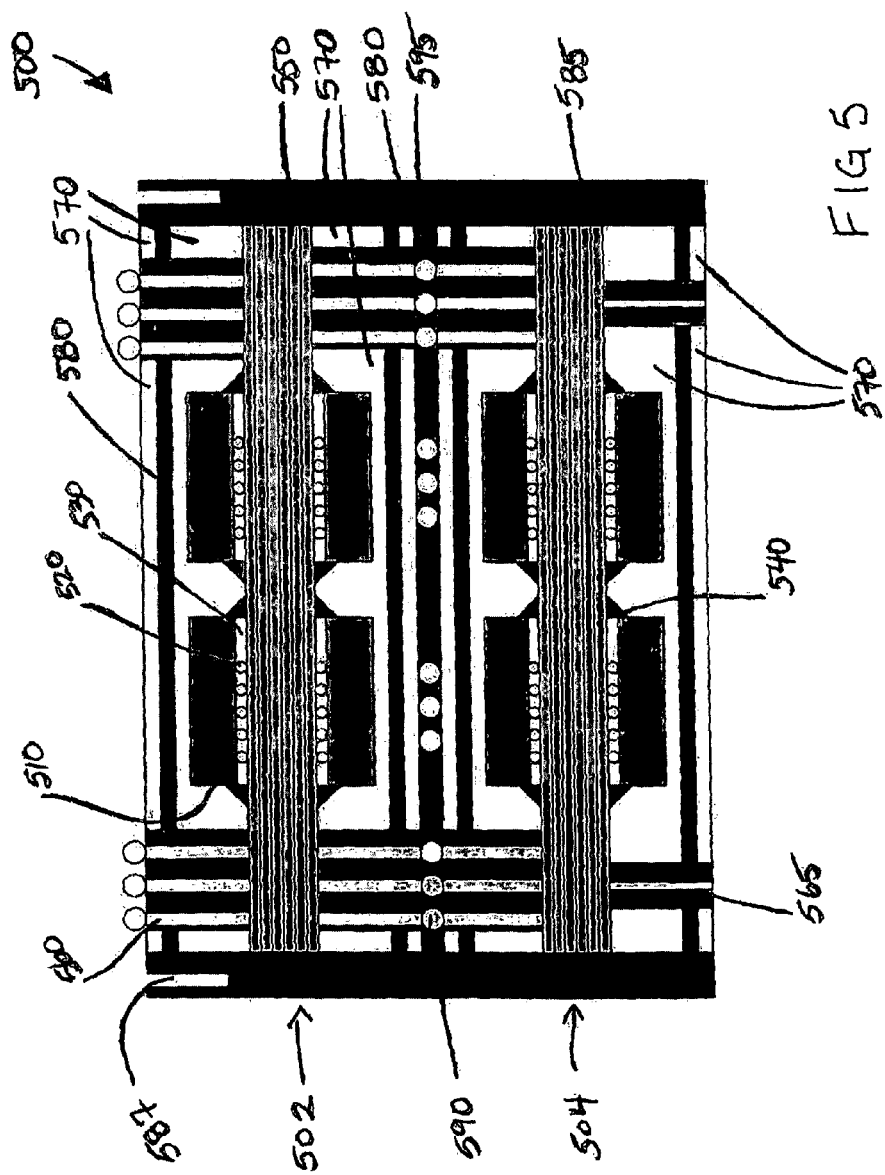
FIG. 5 illustrates an exemplary multichip module assembly in accordance with one aspect of the present invention.

Referring now to FIG. 5, an exemplary MCM assembly 500 in accordance with one aspect of the present invention is shown. MCM assembly 500 includes a plurality of die 510, a dam sealant 540, an interconnect structure 550, an encapsulant 570, a plurality of controlled impedance interconnects 560, and a plurality of thermal management layers such as heat spreaders 580.

Die 510 are connected to interconnect structure 550 via suitable means, such as stud bumps 520. In one aspect, the area between die 510 and interconnect structure 550 comprises a fluid, such as air 530.

Upon inspection, MCM assembly 500 can be broken into a first layer 502 and a second layer 504 which are separated by a cut-away cross-section 595 of heat spreader 580 and attached to each other by stud bumps 590. First layer 502 and second layer 504 are essentially MCM stacking layers which comprise three-dimensional MCM assembly 500.

In one aspect, controlled impedance interconnects 560 further include a dielectric 565. In one aspect, MCM assembly 500 further includes a plurality of additional thermal management layers such as vertical conductive plates 585. As shown, conductive plates 585 include alignment holes 587 for tiling or stacking first layer 502 and second layer 504 and also for possible optical alignment.

Benefits associated with the subject technology is that resulting MCMs or MCM assemblies are low profile and weight. Resulting MCM assemblies can fit together in a tiled configuration and/or be stacked one on top of another. Consequently, the assembly integration density approaches that of wafer scale integration while minimizing cost and allowing for heterogeneous device integration. For example, a cost reduction may be achieved that is between 300% and 1000% of current costs.

Additionally, current-off-the-shelf (COTS) components such as die, interconnect structures, and substrates may be used in assembly. Components can be attached to both sides of a pre-tested interconnect structure or substrate for higher integration density. Furthermore, MCM assemblies may include rigid heat spreaders or substrates for highly planar and thermally stable arrays.

The description of the invention is provided to enable any person skilled in the art to practice the various arrangements described herein. While the present invention has been particularly described with reference to the various figures and configurations, it should be understood that these are for illustration purposes only and should not be taken as limiting the scope of the invention. There may be many other ways to implement the invention. Various functions and elements described herein may be partitioned differently from those shown without departing from the scope of the invention. Various modifications to these configurations will be readily apparent to those skilled in the art, and generic principles defined herein may be applied to other configurations. Thus, many changes and modifications may be made to the invention, by one having ordinary skill in the art, without departing from the scope of the invention.

Unless specifically stated otherwise, the term "some" refers to one or more. A reference to an element in the singular is not intended to mean "one and only one" unless specifically stated, but rather "one or more." By way of example, and not by way of limitation, each of the die, may refer to a plurality of the die according to one aspect of the present invention.

Terms such as "top," "bottom," "horizontal," "vertical," "above," "beneath" and the like as used in this disclosure should be understood as referring to an arbitrary frame of reference, rather than to the ordinary gravitational frame of reference. Thus, a top surface and a bottom surface may extend upwardly, downwardly, diagonally, or horizontally in a gravitational frame of reference.

All structural and functional equivalents to the elements of the various configurations described throughout this disclosure that are known or later come to be known to those of ordinary skill in the art are expressly incorporated herein by reference and intended to be encompassed by the invention. Moreover, nothing disclosed herein is intended to be dedicated to the public regardless of whether such disclosure is explicitly recited in the above description. No claim element is to be construed under the provisions of 35 U.S.C. §112, sixth paragraph, unless the element is expressly recited using the phrase "means for" or, in the case of a method claim, the element is recited using the phrase "step for."

It is understood that the specific order or hierarchy of steps in the processes disclosed is an illustration of exemplary approaches. Based upon design preferences, it is understood that the specific order or hierarchy of steps in the processes may be rearranged. Any accompanying method claims present elements of the various steps in a sample order, which may or may not occur sequentially, and are not meant to be limited to the specific order or hierarchy presented. Furthermore, some of the steps may be performed simultaneously.

What is claimed is:

1. An interconnect assembly for use in high frequency applications, the assembly comprising:
   a first interconnect structure comprising a plurality of layers;
   a first plurality of electronic die disposed on the first interconnect structure;
   a first encapsulant surrounding and directly joining the first plurality of electronic die;
   a first thermal management layer disposed within a portion of the first encapsulant and proximate to the first plurality of electronic die; and
   a first controlled impedance interconnect connected to the first interconnect structure and extending to a peripheral surface of the interconnect assembly.

2. The interconnect assembly of claim 1, wherein the first controlled impedance interconnect extends from an outer surface of the first interconnect structure, the first controlled impedance interconnect extends through the first encapsulant and the first thermal management layer, the first controlled impedance interconnect is disposed adjacent to and extends along a side of the first plurality of electronic die, and the first controlled impedance interconnect is separate from the first interconnect structure.

3. The interconnect assembly of claim 1, further comprising a second controlled impedance interconnect, wherein the first controlled impedance interconnect is disposed on a first side of the first interconnect structure, and the second controlled impedance interconnect is disposed on a second side of the first interconnect structure, and wherein the first and second sides of the first interconnect structure are opposite to each other.

4. The interconnect assembly of claim 1, wherein the first thermal management layer includes electronic routing components.

5. The interconnect assembly of claim 1, further comprising:
   an underfill material in between at least one of the first plurality of electronic die and the first interconnect structure.

6. The interconnect assembly of claim 1, further comprising a second plurality of electronic die, wherein the first plurality of electronic die and the first controlled impedance interconnect are disposed on a first side of the first interconnect structure, and the second plurality of die are disposed on a second side of the first interconnect structure, and wherein the first and second sides of the first interconnect structure are opposite to each other.

7. The interconnect assembly of claim 1, further comprising a second thermal management layer extending vertically along a side of the first plurality of electronic die and along a side of the first interconnect structure.

8. The interconnect assembly of claim 1, wherein at least one of the first plurality of electronic die comprises a die and a chip support package.

9. An assembly comprising the interconnect assembly of claim 1, the assembly further comprising:
  a second interconnect assembly comprising:
    a second interconnect structure comprising a plurality of layers;
    a second plurality of electronic die disposed on the second interconnect structure;
    a second encapsulant at least partially surrounding the second plurality of electronic die;
    a second thermal management layer disposed within a portion of the second encapsulant and proximate to the second plurality of electronic die; and
    a second controlled impedance interconnect connected to the second interconnect structure and extending to a peripheral surface of the second interconnect assembly,
  wherein the second interconnect assembly is stacked on top of the first interconnect assembly.

10. The assembly of claim 9, further comprising:
  a third thermal management layer disposed between the interconnect assembly and the second interconnect assembly,
  wherein the second interconnect assembly further comprises a fourth thermal management layer that is disposed adjacent to, and extends vertically along, a side of the second interconnect structure, a side of the second plurality of electronic die, and/or a side of the second encapsulant.

11. An assembly comprising the interconnect assembly of claim 1, the assembly further comprising:
  a second interconnect assembly comprising:
    a second interconnect structure comprising a plurality of layers;
    a second plurality of electronic die disposed on the second interconnect structure;
    a second encapsulant at least partially surrounding the second plurality of electronic die;
    a second thermal management layer disposed within a portion of the second encapsulant and proximate to the second plurality of electronic die; and
    a second controlled impedance interconnect connected to the second interconnect structure and extending to a peripheral surface of the second interconnect assembly,
  wherein the second interconnect assembly is stacked on top of the interconnect assembly,
  wherein the interconnect assembly further comprises a third plurality of electronic die, wherein the first plurality of electronic die and the first controlled impedance interconnect are disposed on a first side of the first interconnect structure, and the third plurality of die are disposed on a second side of the first interconnect structure, wherein the first and second sides of the first interconnect structure are opposite to each other,
  wherein the second interconnect assembly further comprises a fourth plurality of electronic die, wherein the second plurality of electronic die and the second controlled impedance interconnect are disposed on a first side of the second interconnect structure, and the fourth plurality of die are disposed on a second side of the second interconnect structure, and wherein the first and second sides of the second interconnect structure are opposite to each other.

12. An interconnect assembly comprising:
  an interconnect structure comprising a plurality of layers, each of the plurality of layers comprising electronic routing components;
  a plurality of electronic die disposed on the interconnect structure;
  an encapsulant surrounding and directly joining the plurality of electronic die;
  a thermal management layer disposed within the encapsulant; and
  a plurality of controlled impedance interconnects connected to the interconnect structure and extending through a portion of the encapsulant to a peripheral surface of the interconnect assembly,
  wherein the plurality of controlled impedance interconnects comprise copper or copper alloy surrounded by a dielectric.

13. The interconnect assembly of claim 12, wherein the plurality of controlled impedance interconnects extend to a plurality of peripheral surfaces of the interconnect assembly.

* * * * *